United States Patent
Xu et al.

(10) Patent No.: US 12,136,796 B2
(45) Date of Patent: Nov. 5, 2024

(54) ELECTRO-ABSORPTION MODULATED LASER WITH INTEGRATED FILTER LAYER

(71) Applicant: Applied Optoelectronics, Inc., Sugar Land, TX (US)

(72) Inventors: Dapeng Xu, Houston, TX (US); Jin Huang, Sugar Land, TX (US); Huanlin Zhang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 662 days.

(21) Appl. No.: 17/405,416

(22) Filed: Aug. 18, 2021

(65) Prior Publication Data

US 2023/0053516 A1    Feb. 23, 2023

(51) Int. Cl.
| | |
|---|---|
| H01S 3/10 | (2006.01) |
| H01S 5/026 | (2006.01) |
| H01S 5/065 | (2006.01) |
| H01S 5/12 | (2021.01) |
| H01S 5/20 | (2006.01) |
| H01S 5/22 | (2006.01) |
| H01S 5/343 | (2006.01) |
| H01S 5/028 | (2006.01) |

(52) U.S. Cl.
CPC ............ *H01S 5/0265* (2013.01); *H01S 5/026* (2013.01); *H01S 5/0653* (2013.01); *H01S 5/12* (2013.01); *H01S 5/2022* (2013.01); *H01S 5/22* (2013.01); *H01S 5/34326* (2013.01); *H01S 5/028* (2013.01); *H01S 5/2054* (2013.01)

(58) Field of Classification Search
CPC ...... H01S 5/0265; H01S 5/026; H01S 5/0653; H01S 5/12; H01S 5/2022; H01S 5/22; H01S 5/34326
See application file for complete search history.

(56) References Cited

U.S. PATENT DOCUMENTS

| | | | |
|---|---|---|---|
| 6,455,908 B1 * | 9/2002 | Johnson | B82Y 20/00 257/190 |
| 8,383,435 B2 | 2/2013 | Rosso et al. | |
| 10,608,408 B1 * | 3/2020 | Lin | G02B 6/4274 |

(Continued)

FOREIGN PATENT DOCUMENTS

CN    1437289 A    8/2003

OTHER PUBLICATIONS

T. Coroy, R.M. Measures, T.H. Wood, C.A. Burrus, "Active Wabelength Meassurement System Using an InGaAs—InP Quantum-Well Electroabsorption Filtering Detector", IEEE Photonics Technolgy Letters, vol. 8, No. 12, Dec. 1996, 3 pgs.

(Continued)

*Primary Examiner* — Kinam Park
(74) *Attorney, Agent, or Firm* — Grossman Tucker Perreault & Pfleger, PLLC

(57) ABSTRACT

The present disclosure is generally directed to an EML with a filter layer disposed between an active region of the EML and a substrate of the EML to absorb a portion of unmodulated light energy, and preferably the unmodulated light energy caused by transverse electric (TE) substrate mode. The filter layer preferably comprises a material with an energy band gap (Eg) that is less than the energy band gap of the predetermined channel wavelength to absorb unmodulated laser light.

20 Claims, 9 Drawing Sheets

(56) References Cited

U.S. PATENT DOCUMENTS

| | | | |
|---|---|---|---|
| 2002/0080836 A1* | 6/2002 | Hwang | H01S 5/18375 372/45.01 |
| 2003/0095737 A1* | 5/2003 | Welch | H01S 5/0683 385/14 |
| 2008/0013881 A1* | 1/2008 | Welch | G02B 6/131 385/14 |
| 2008/0138088 A1* | 6/2008 | Welch | H01S 5/026 398/183 |

OTHER PUBLICATIONS

Ryo Nakao, Masakazu Arai, Wataru Kobayashi, Tsuyoshi Yamamoto, Shinji Matsuo, "1.3 um InGaAs MQW Metamorphic Laser Diode Fabricated With Lattice Relaxation Control Based on In Situ Curvature Measurement", IEEE Journal of Selected Topics in Quantum Electronics, vol. 21, No. 6, Nov./Dec. 2015, 7 pgs.

Jack Jia-Sheng Huang et al., "Defect Diffusion Model of InGaAs/InP Semiconductor Laser Degradation", Applied Physics Research, Jan. 2016, 10 pgs.

Eric J. Lerner, "The photodiode is the workhorse of detection", Laser Focus World, Nov. 1, 2001, 17 pgs.

* cited by examiner

ELECTRO-ABSORPTION MODULATED LASER WITH INTEGRATED FILTER LAYER

TECHNICAL FIELD

The present disclosure relates generally to optical devices, and more particularly, to an electro-absorption modulated laser having an integrated filter layer for absorbing unmodulated light energy and providing an improved extinction ratio (ER) during operation.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceiver modules generally include one or more transmitter optical subassemblies (TOSAs) for transmitting optical signals. TOSAs can include one or more lasers to emit one or more channel wavelengths and associated circuitry for driving the lasers. In scenarios where long-distance and/or high-bandwidth speeds are desired, TOSAs are generally implemented with Electro-absorption Modulated Lasers (EMLs) rather than direct modulated lasers (DML) due to, for example, the relatively small chromatic dispersion of EMLs.

However, scaling of EMLs and the desire to reach production bandwidths of greater than 100 Gbps, for example, raises numerous non-trivial challenges.

BRIEF DESCRIPTION OF THE DRAWINGS

These and other features and advantages will be better understood by reading the following detailed description, taken together with the drawings wherein.

DETAILED DISCLOSURE

Figure 7:
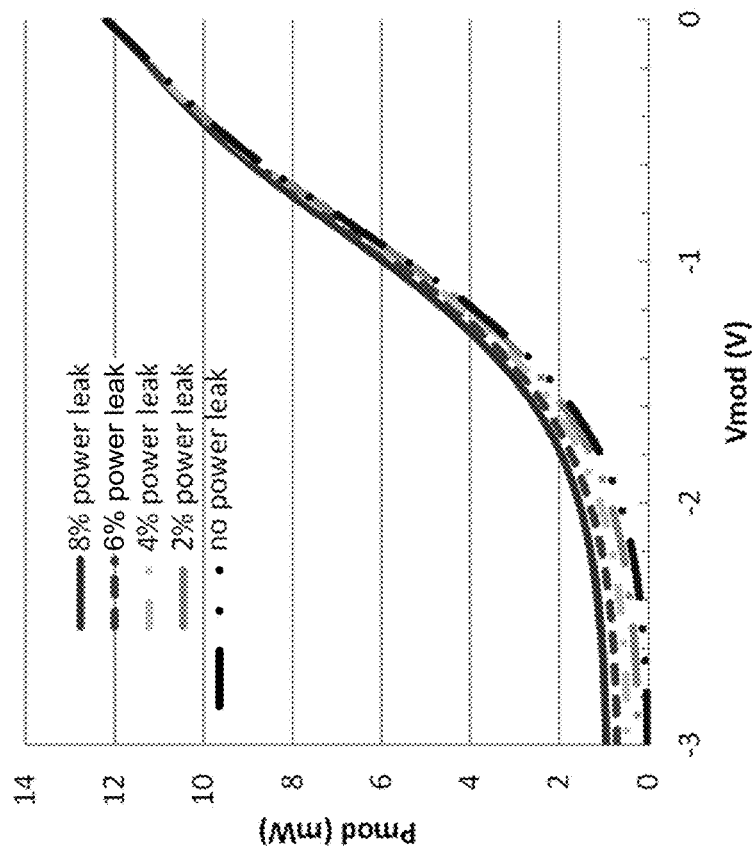
FIG. 7 shows an example plot showing current/power values relative to modulated voltage for a plurality of EML laser configurations.
Figure 6:
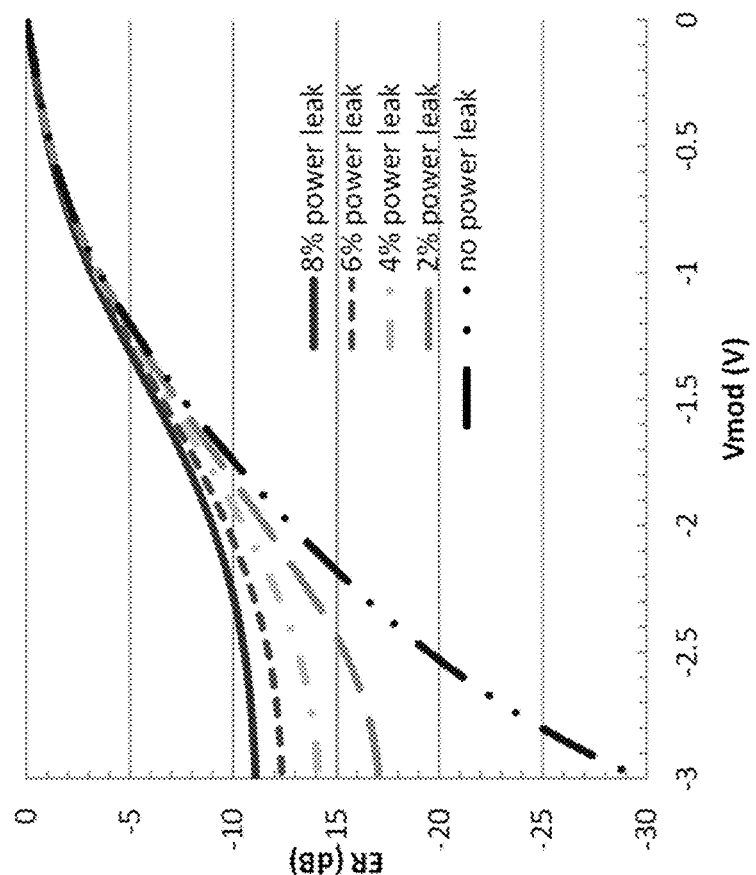
FIG. 6 shows an example plot of extinction ratio (ER) degradation relative to modulated voltage for a plurality of EML laser configurations.

One approach to forming EMLs includes using a butt-joint regrowth technique whereby the distributed feedback (DFB) section and the electro-absorption modulator (EAM) section are formed separately and coupled together via a butt-joint. This can result in a bending tail for the modulator waveguide (also referred to as a waveguide core) at the butt-joint interface in addition to misalignment between the DFB and EAM sections. Performance may then be degraded for the EML, particularly through the substrate mode whereby light emission is propagated via the substrate layer. In the substrate mode, light may then be scattered or leaked. This scattered light emitted from the EML is unmodulated and can contribute to extinction ratio (ER) degradation and transfer curve steepness. The ER of an EML is a significant factor in the maximum production bandwidth an EML can achieve. For example, FIG. 6 shows an example plot that illustrates the ER degradation relative to voltage modulation (Vmod) applied to the DFB section of an EML, with the majority of the ER degradation being introduced by losses through the substrate mode. FIG. 7 shows an example plot that illustrates relative power (in milliwatts) for the same range of voltage modulation (Vmod) values as shown in FIG. 6.

There exists a need to improve the ER of an EML laser to allow for continued scaling and to achieve production bandwidths beyond 100 Gbps, for example.

Thus, the present disclosure is generally directed to an EML with a filter layer disposed between an active region of the EML and a substrate of the EML to absorb a portion of unmodulated light energy, and preferably the unmodulated light energy caused by transverse electric (TE) substrate mode. The filter layer may also be referred to herein as an absorptive filter layer. The EML is configured to emit a predetermined channel wavelength, e.g., a range of 1260 nm to 1650 nm although other channel wavelengths are within the scope of this disclosure. The filter layer preferably comprises a material with an energy band gap (eV) that is less than the energy band gap of the predetermined channel wavelength to absorb unmodulated laser light. In one example, the predetermined channel wavelength of the EML is in a range of 1260 nm to 1650 nm and therefore has an associated energy band gap in a range of 0.984 to 0.752 eV when operating at 300 Kelvin. In this example, the filter layer comprises indium gallium arsenide (InGaAs), which has an energy band gap of around 0.75 eV when operating at 300 Kelvin.

An EML consistent with the present disclosure can also preferably include a spacer layer disposed between the filter layer and the active region to provide a predetermined offset distance between the active region and the filter layer, and more specifically, between a waveguide core of the active region and the filter layer. The spacer layer can comprise n-doped InP, for example, and may also contribute to an overall amount of unmodulated light that gets absorbed/filtered out.

An EML consistent with aspects of the present disclosure have numerous advantages over existing EML processes. For example, an EML consistent with the present disclosure can achieve an improved ER and transfer curve steepness based on unmodulated laser light being absorbed by the filter layer. In addition, an EML consistent with the present disclosure can be formed via butt-joint process while still achieving improved operating performance, e.g., based on the increased ER and transfer curve steepness.

The term "coupled" as used herein refers to any connection, coupling, link or the like between elements and "optically coupled" refers to coupling such that light from one element is imparted to another element. Such "coupled" devices are not necessarily directly connected to one another and may be separated by intermediate components or, in the context of optical coupling, devices that may manipulate or modify such signals. On the other hand, the term "direct" in the context of coupling/connecting refers to coupling between elements that does not include intermediate elements such as an intervening layer of material. Note, the term "disposed on" in the context of material layers disclosed herein refers to a first material layer that can be directly disposed on a second material layer (e.g., without an intervening intermediate layer disposed therebetween) or indirectly on the second material layer.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Figure 1:
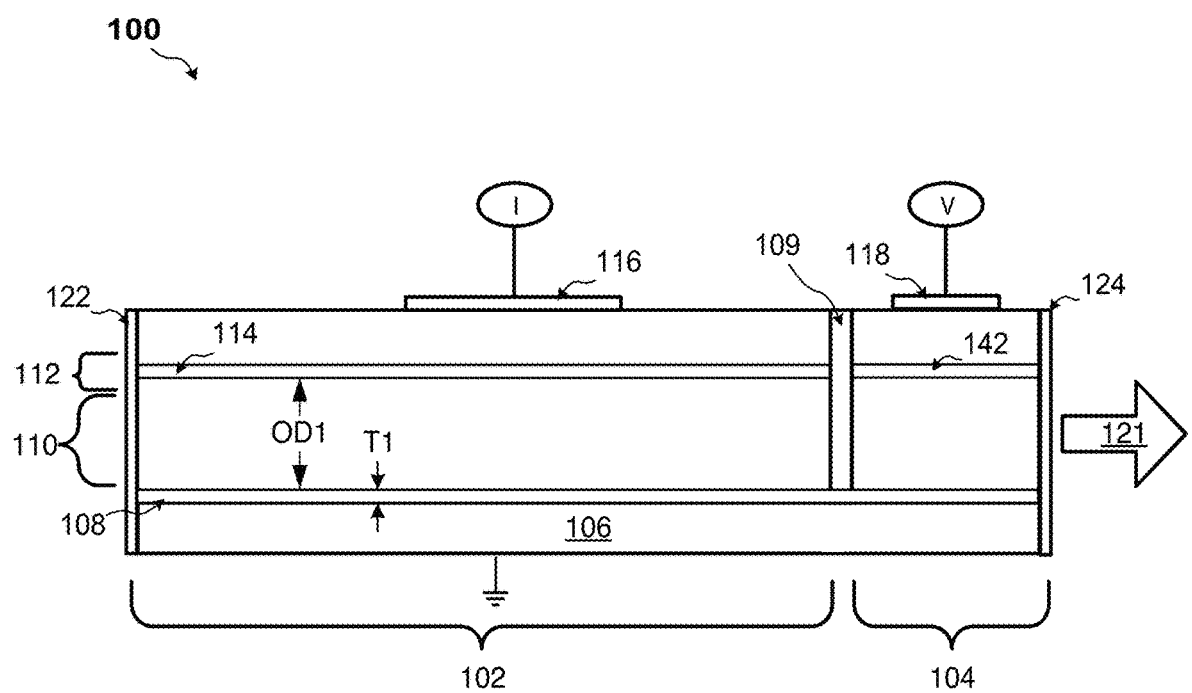
FIG. 1 shows an example photonic integrated circuit (PIC) consistent with aspects of the present disclosure.

FIG. 1 shows an example PIC 100 consistent with aspects of the present disclosure. In particular, the PIC 100 is implemented as an electro-absorption modulated laser (EML) and is shown in a simplified form for purposes of clarity and ease of description. Like numerals refer to like elements unless otherwise provided herein.

As shown, the PIC 100 includes a distributed feedback laser (DFB) section 102 and a electro-absorption modulator (EAM) section 104.

Each of the DFB section 102 and the EAM section 104 are preferably disposed on substrate 106. The substrate 106 preferably comprises N-doped indium phosphide (InP), although other materials such as GaAs may also be utilized to form the substrate 106.

Preferably, the DFB section 102 and the EAM section 104 are formed on the substrate 106 via metal organic chemical vapor deposition (MOCVD) or other suitable semiconductor process. More preferably, the DFB section 102 and the EAM section 104 are formed by MOCVD and coupled together via butt-joint regrowth. The resulting structure of the PIC 100 further preferably includes an isolation section 109 that is at the interface/junction between the DFB section 102 and the EAM section 104 and can be formed by chemical etching or ion implantation, for example.

The DFB section 102 preferably comprises a filter layer 108 that is preferably disposed directly on the substrate 106, which may also be referred to herein as an absorption layer. The filter layer 108 preferably comprises a material having an energy bandgap (Eg) that is less than or equal to the energy bandgap for the PIC 100.

In one preferred example, the PIC 100 is configured to emit laser light 121 at 1550 nm and have an eV of 0.8, when operating at 300 Kelvin (e.g., room temperature). In this example, the filter layer 108 preferably comprises a material such as Indium gallium arsenide (InGaAs) which has an energy band gap of 0.75 eV. Some additional non-limiting preferred materials for the filter layer 108 also include Indium gallium arsenide phosphide (InGaAsP), indium gallium arsenide phosphide antimony (InGaAsSb), and aluminum gallium indium arsenic (AlGaInAs).

The filter layer 108 preferably includes an overall thickness T1 in a range of 20 nm to 200 nm (200 to 2000 Angstrom (A)). More preferably, the overall thickness T1 of the filter layer 108 is 100±20 nm. The filter layer 108 preferably includes a substantially continuous thickness, e.g., within ±5 A end-to-end. However, the thickness T1 of the filter layer 108 may vary along its length. In addition, the filter layer 108 is preferably configured to not to extend through the DFB section 102. The filter layer 108 may also extend through DFB 102 and EAM 104 as shown in FIG. 1, e.g., to simplify manufacturing.

The filter layer 108 is also preferably disposed at an overall offset OD1 from a waveguide core provided by a multi-quantum well (MQW) 114. The overall offset OD1 distance preferably measures in a range from 1.5 microns to 3 microns, and more preferably, 2±0.5 microns. The overall offset OD1 may be substantially continuous, e.g., within ±5 A end-to-end, or may vary from end-to-end.

The active region 112 can comprise a plurality of material layers to form the MQW 114 of the DFB section 102 and the MQW 142 of the EAM section 104. The active region 112 preferably includes confinement layers (not shown) disposed on opposite sides of the MQW 114 of the DFB section 102 and the MQW 142 of the EAM section 104.

The DFB section 102 and the EAM section 104 further preferably include one or more intermediate layers 110. The one or more intermediate layers 110 of the DFB section 102 and the EAM section 104 are preferably implemented with identical materials and/or layer thicknesses for at least the respective MQWs.

The one or more intermediate layers 110 are preferably disposed between the filter layer 108 and the active region 112. The thickness of the one or more intermediate layers 110 can be predetermined in order to provide the overall offset OD1 between the filter layer 108 and the waveguide core provided by the active region 112. Confinement layers (not shown) can be disposed on opposite sides of the active region 112, examples of which are discussed further below. The DFB section 102 further includes one or more layers shown generally at 116 to provide a contact (or metal contact) for electrically coupling a laser bias current (I) to the DFB section 102. Likewise, the EAM section 104 further preferably includes one or more layers generally shown at 118 to provide a contact for electrically coupling a voltage (V) to the EAM section 104 for modulation purposes.

The PIC 100 further preferably includes a highly reflection (HR) layer 122 disposed at a distal end of the PIC 100 defined by the DFB section 102. The PIC 100 further preferably includes an antireflective (AR) layer 124 disposed at a distal end (e.g., the output end for laser light 121) defined by the EAM section 104.

Figure 2:
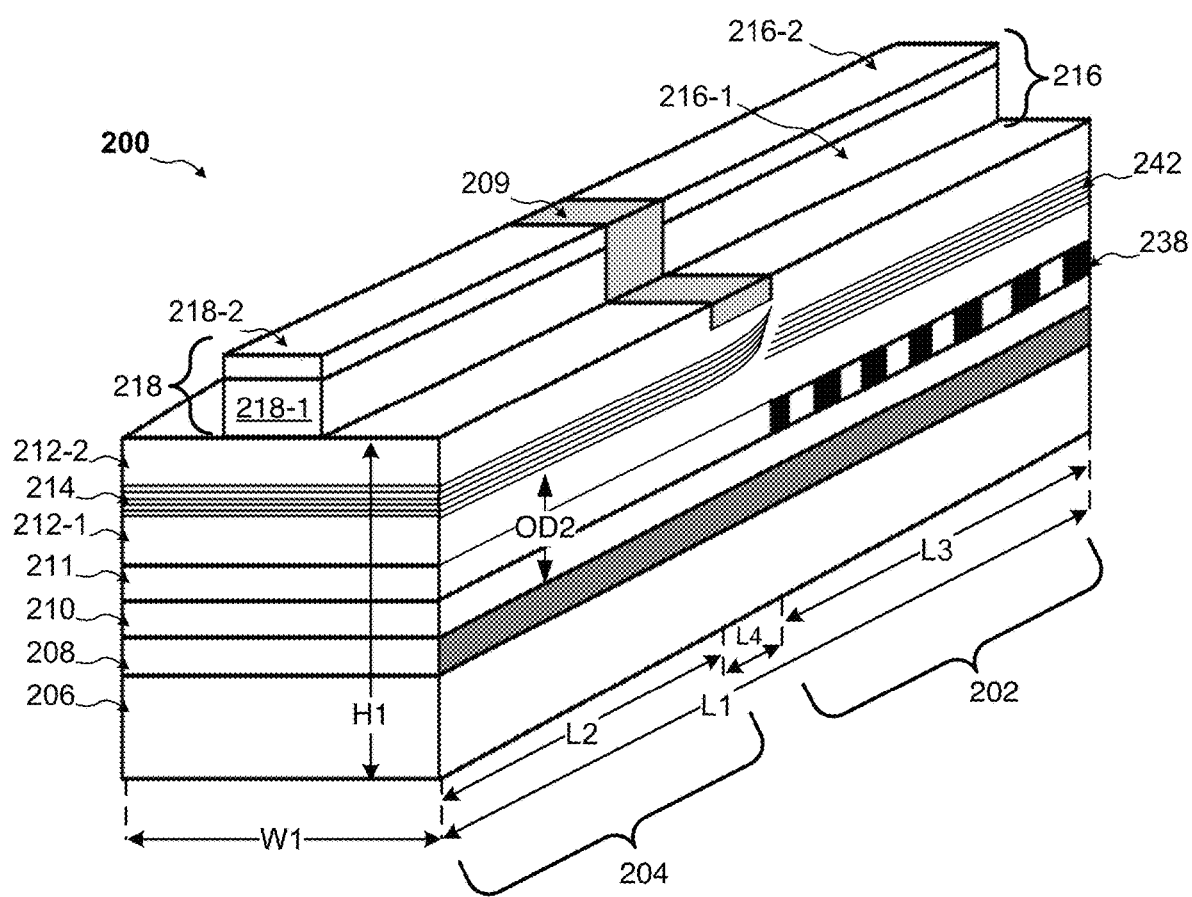
FIG. 2 shows an example electro-absorption modulated laser (EML) consistent with aspects of the present disclosure.

FIG. 2 shows an example of the PIC 100 implemented as an EML 200. As shown, the EML 200 includes a butt-joint configuration whereby the DFB section 202 is coupled to the EAM section 204.

As shown, the DFB section 202 is preferably provided by a first plurality of material layers disposed on the substrate 206, and the EAM section 204 is provided by a second plurality of material layers. One or more of the material layers forming the DFB section 202 and the EAM section 204 can be common/shared layers such as the filter layer 208 and the spacer layer 210. However, the material layers of the DFB section 202 and the EAM section 204 forming the active region and MQW, for example, may be separated/bifurcated by the isolation section 209.

As discussed above, the DFB section 202 and the EAM section 204 preferably include a substantially similar layer structure such that, for example, the material layers providing the respective MQWs are formed from substantially similar material layers and material layer thickness. More preferably, the respective MQWs of the DFB section 202 and the EAM section 204 include an identical configuration. However, the DFB section 202 and the EAM section 204 can include different layer configurations and/or material compositions for the constituent layers including the MQWs.

As shown in FIG. 2, the EML 200 includes a substrate 206 upon which the DFB section 202 and the EAM section 204 are formed, e.g., using a MOCVD approach as discussed above. The substrate 206 preferably comprises, for example, n-doped InP. However, the substrate 206 can comprise other materials such as GaAs, GaSb, and/or GaP.

A filter layer 208 is preferably disposed on the substrate 206 and preferably extends beneath DFB section 202 and the EAM section 204, and thus underlies and supports the material layers forming the same. More preferably, the filter layer 208 is directly disposed on the substrate 206 such as shown in FIG. 2. The overall thickness of the filter layer 208 is preferably in a range of 200 to 2000 Angstrom (A), as discussed above. Preferably, the filter layer 208 comprises n-doped InGaAs, although other materials are within the scope of this disclosure. In one preferred example, the filter layer 208 comprises a material with an energy bandgap that is less than or equal to a DFB emission photon emission energy for the EML 200. Thus, the filter layer 208 comprises a material with an energy bandgap that is less than or equal to the predetermined channel wavelength emitted by the DFB section 202. The predetermined channel wavelength is preferably in a range of 1260 to 1650 nm, although other channel wavelengths are in the scope of this disclosure. Some non-limiting additional example materials having an energy band gap that comports with this preferred range include InGaAsP, InGaAsSb, and AlGaInAs.

A spacer layer 210 is preferably disposed on the filter layer 208. More preferably, the spacer layer 210 is disposed directly on the filter layer 208. The spacer layer 210 preferably has an overall thickness in a range of 1.2 to 1.8 microns. The spacer layer 210 preferably comprises n-doped InP, although other materials are within the scope of this disclosure. The overall thickness of the spacer layer 210 may be predetermined to ensure that the overall offset distance OD2 between the filter layer 208 and a waveguide core of the MQW 214 (and/or MQW 242) is preferably in a range of 1.5 microns to 3 microns.

A grating layer 211 is preferably disposed on the spacer layer 210. The grating layer 211 preferably comprises InGaAsP, although other materials such as InGaP are suitable for use.

A first confinement layer 212-1 is preferably disposed on the grating layer 211. The first confinement layer 212-1 is preferably implemented as a separate-confinement heterostructure (SCH). The first confinement layer 212-1 preferably has an overall thickness in a range of 200 to 2000 A. The first confinement layer 212-1 preferably comprises n-doped InGaAsP, although other materials such as InGaAlAs are within the scope of this disclosure.

A plurality of layers providing the MQW 214 is preferably disposed on the first confinement layer 212-1. The MQW 214 preferably includes an overall thickness in a range of 1000 to 2000 A. The material layers forming the MQW 214 preferably comprise InGaAsP, although other material such as InGaAlAs are within the scope of this disclosure.

A second confinement layer 212-2 is preferably disposed on the MQW 214. The second confinement layer 212-2 is preferably implemented as an SCH. The second confinement layer 212-2 preferably has an overall thickness in a range of 200 to 2000 A. The second confinement layer 212-2 preferably comprises p-doped InGaAsP, although other materials such as InGaAlAs are within the scope of this disclosure.

A contact section 218 is preferably disposed on the second confinement layer 212-2. Preferably, the contact section 218 includes a top cladding layer 218-1 disposed on the second confinement layer 212-2, and a contact layer 218-2 disposed on the top cladding layer 218-1. The top cladding layer 218-1 of the contact section 218 preferably includes an overall thickness in a range of 1.5 to 2.2 microns. The top cladding layer 218-1 of the contact section 218 further preferably comprises p-doped InP, although other materials are within the scope of this disclosure such as AlGaInAs. The top cladding layer 218-1 can be configured with a pedestal structure, such as shown, although other shapes/profiles are within the scope of this disclosure. The contact layer 218-2 preferably includes an overall thickness in a range of 500 to 2000 A. The contact layer 218-2 further preferably comprises p-doped InGaAs to provide a p-contact layer for the EAM section 204.

The isolation section 209 is preferably disposed between the DFB section 202 and the EAM section 204, and bifurcates one or more constituent material layers forming each. The isolation section 209 preferably includes an overall length L4 in a range of 20 to 200 microns.

As discussed above, the material layers forming the DFB section 202 can be configured substantially identical to the material layers forming the EAM section 204. However, and as shown, the DFB section 202 can include material layers such as the grating layer 238 which can be formed from a material such as InGaAsP, and not necessarily be the same material as grating layer 211, which occupies the same horizontal plane. However, and as shown in FIG. 2, the material layer structure of the DFB section 202 preferably includes a configuration that ensures that a MQW 242 provided by the same aligns optically with the MQW 214 provided by the EAM section 204 to reduce light leakage and power loss.

In addition, the material layers forming the contact section 216 for the DFB section 202 preferably includes a top cladding layer 216-1, and a contact layer 216-2 disposed on the top cladding layer 216-1. The top cladding layer 216-1 preferably comprises InP, although other materials are suitable for use. In addition, the contact layer 216-2 preferably comprises InGaAs, although other materials are suitable for use.

The EML 200 preferably includes an overall width W1 in a range of 0.5 to 2.5 microns and an overall length L1 in a range of 80 to 200 microns. Thus, the filter layer 208 preferably includes an overall length equal to the overall length L1.

The overall length L2 of the material layers forming the EAM section 204 is preferably in a range of 80 to 200 microns. Likewise, the overall length L3 of the DFB section 202 is preferably in a range of 250 to 500 microns. More preferably, the EAM section 204 has an overall length L2 of 150±25 microns and the DFB section 202 has an overall length L3 of 350±50 microns. The overall height H1 from the bottom of the substrate 206 to the top of the second confinement layer 212-2 preferably measures in a range of 80 to 150 microns.

One example process for forming an EML consistent with the present disclosure, such as the EML 200 of FIG. 2, can includes the following. The process begins with receiving a substrate, such as the substrate 206. A filter layer, such as the filter layer 208, is then disposed/grown on the substrate 206. A spacer layer, such as spacer layer 210 is then disposed/grown on the filter layer. The process can continue with disposing/growing additional material layers on the substrate to provide an EAM section and a DFB section, such as the EAM section 204 and the DFB section 202 described above. The EAM section and the DFB section are preferably formed using a butt-joint process. Respective (electrical) contact sections for the DFB and EAM section may then be disposed/grown. Some examples of which can include the contact sections 216 and 218 of the DFB section 202 and EAM section 204, respectively, of FIG. 2.

Figure 3:
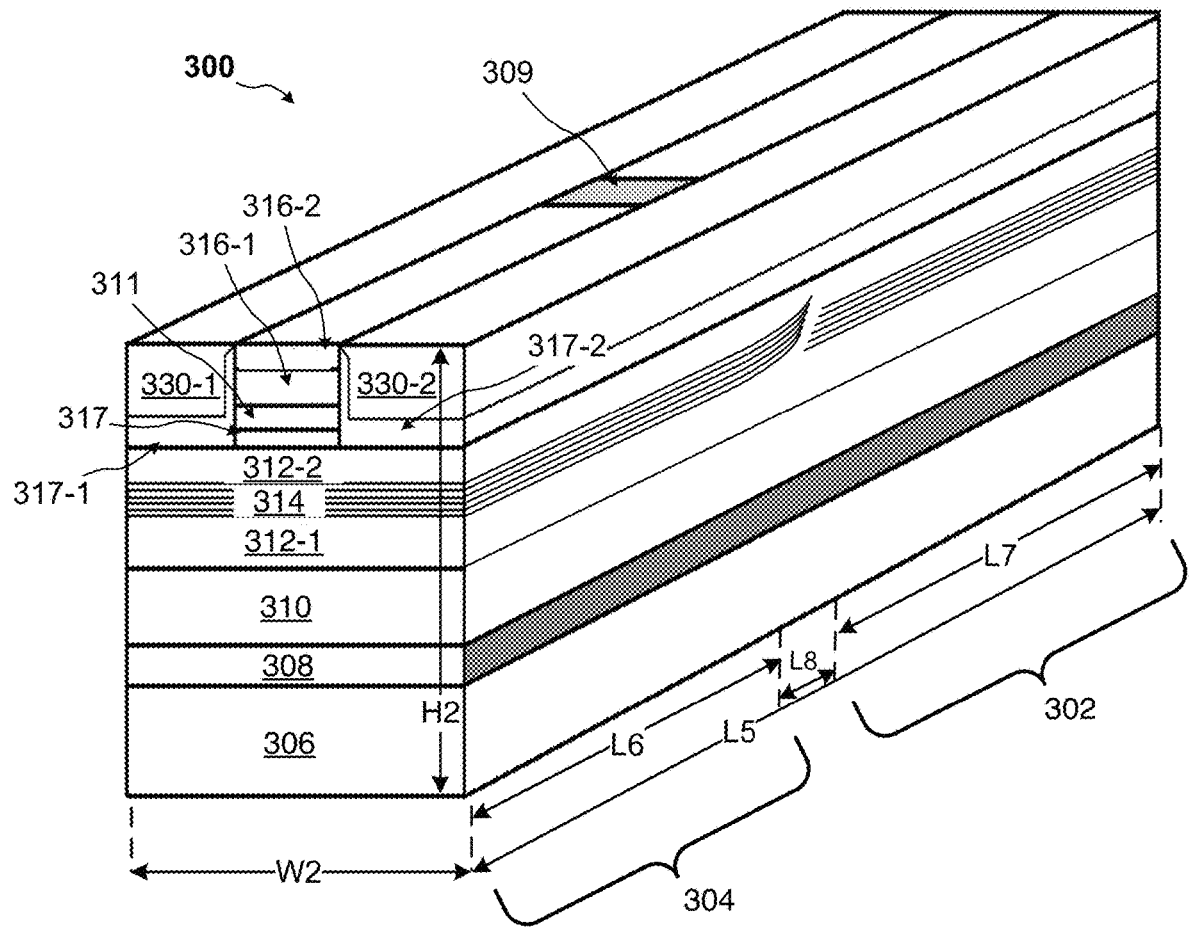
FIG. 3 shows an example ridge-waveguide (RWG) EML consistent with aspects of the present disclosure.

FIG. 3 shows an example ridge-waveguide (RWG) laser 300 consistent with aspects of the present disclosure. The RWG laser 300 preferably includes a DFB section 302 and an EAM section 304 formed atop a substrate 306, which may also be referred to as a common substrate. More preferably, the RWG laser 300 includes a filter layer 308 comprising n-doped InGaAs disposed between the substrate 306 and a waveguide core provided by the MQW 314. The RWG laser 300 can be formed substantially similar to that of the EML 200 of FIG. 2, the various descriptions of material layers and layer configurations of which will not be repeated for brevity. However, and as shown, the RWG laser 300 features a different configuration following the filter layer 308 to provide the RWG laser structure.

In particular, the RWG laser 300 further preferably includes a spacer layer 310 disposed on the filter layer 308. The spacer layer 310 preferably comprises a material such as InP. The overall thickness of the spacer layer 310 can be the same as the spacer layer 210 of the EML 200 (See FIG. 2) to provide the predetermined offset distance between the filter layer 308 and a waveguide core of the MQW 314. However, as shown the spacer layer 310 can be bifurcated by an isolation section 309 that is disposed between the material layers forming the DFB section 302 and the EAM section 304. The overall length L8 of the isolation section 309 is preferably in a range of 20 to 200 microns.

A first confinement layer 312-1 is preferably disposed on the spacer layer 310. An MQW 314 is preferably disposed on the first confinement layer 312-1. A second confinement layer 312-2 is preferably disposed on the MQW 314.

Following the second confinement layer 312-2, the RWG laser 300 preferably includes first and second dielectric layers 317-1, 317-2 that can comprise a material such as SiO2 and Si3N4. The first and second dielectric layers 317-1, 317-2 are preferably disposed on the second confinement layer 312-2. A spacer layer 317 comprising a material such as InP, for example, is disposed between the first and second dielectric layers 317-1, 317-2 and is preferably also disposed directly on the second confinement layer 312-2, such as shown. A grating layer 311 is then preferably disposed on the p-spacer layer 317. The grating layer 311 is also further preferably disposed between the first and second dielectric layers 317-1, 317-2. A top cladding layer 316-1 is preferably disposed on the grating layer 311. The top cladding layer 316-1 preferably comprises InP, although other materials are within the scope of this disclosure. A contact layer 316-2 is preferably disposed on the top cladding layer 316-1. The contact layer 316-2 preferably comprises InGaAs, although other materials are within the scope of this disclosure.

The RWG laser 300 further preferably includes first and second isolation layers 330-1, 330-2. The first and second isolation layers 330-1, 330-2 preferably comprise Benzocyclobutene (BCB), although other dielectric materials are within the scope of this disclosure. The first and second isolation layers 330-1, 330-2 are preferably disposed on the first and second dielectric layers 317-1, 317-2. More preferably, a portion of the first and second dielectric layers 317-1, 317-2 is disposed between the first and second isolation layers 330-1, 330-2 and the material layers such as the grating layer 311, top cladding layer 316-1, contact layer 316-2 disposed therebetween, such as shown.

The overall length L5 of the RWG laser 300 is preferably in a range of 450 to 900 microns. The overall width W2 of the RWG laser 300 is preferably in a range of 200 to 500 microns. The overall height H2 of the RWG laser 300 is preferably in a range of 80 to 150 microns. The overall length L6 of the EAM section 304 is preferably in a range of 80 to 200 microns. The overall length L7 of the DFB section 302 is preferably in a range of 250 to 500 microns.

Figure 4A:
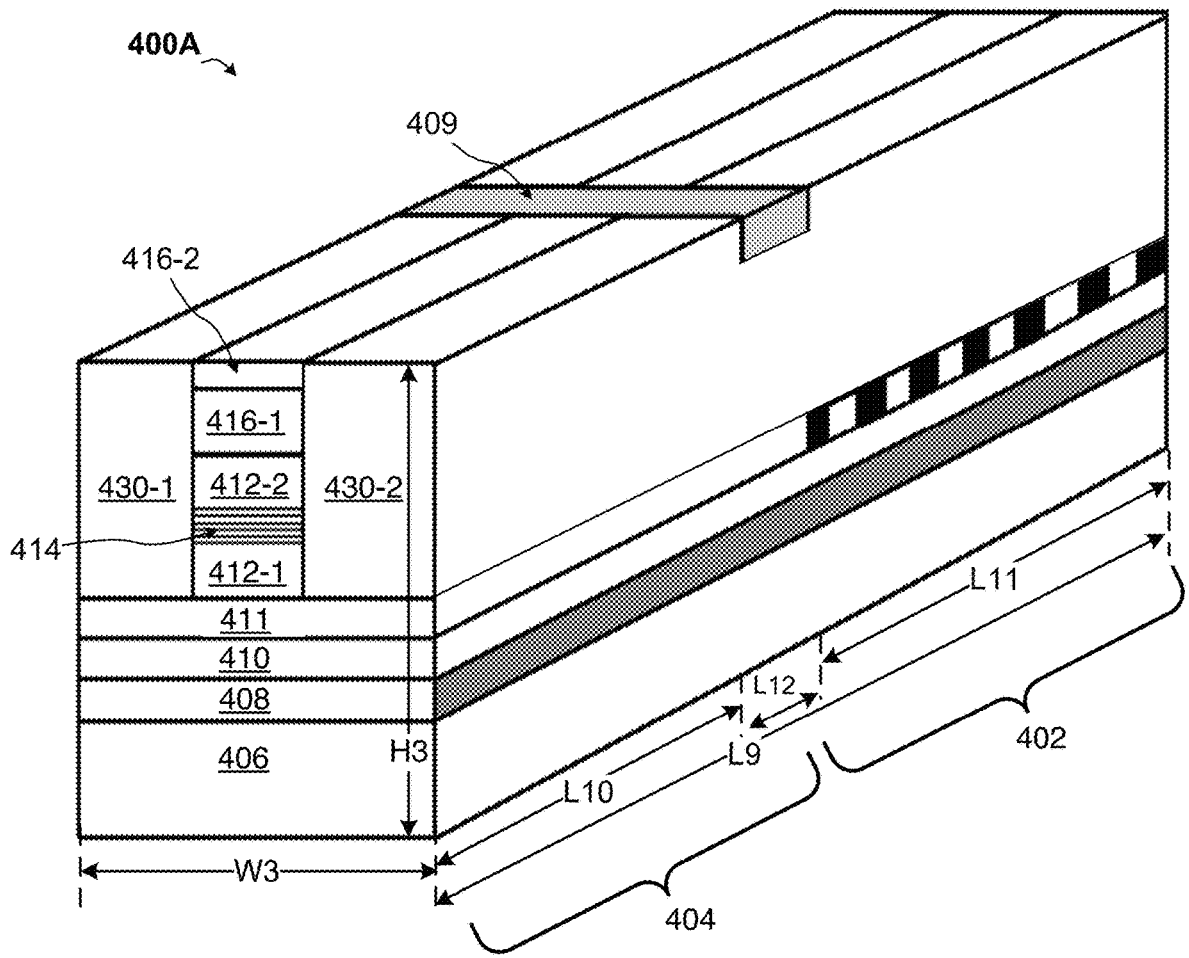
FIG. 4A shows an example buried heterostructure (BH) EML consistent with aspects of the present disclosure.

FIG. 4A shows an example of a buried heterostructure (BH) EML 400A consistent with aspects of the present disclosure. The BH EML 400A preferably includes a DFB section 402 and an EAM section 404 section formed atop a substrate 406, which may be referred to herein as a common substrate. More preferably, the BH EML 400A includes a filter layer 408 comprising n-doped InGaAs disposed between the substrate 406 and the waveguide core provided by the MQW 414.

The BH EML 400A can be formed substantially similar to that of the EML 200 of FIG. 2, the various descriptions of material layers and layer configurations of which will not be repeated for brevity. However, and as shown, the BH EML 400A features a different configuration following the filter layer 408 to provide the BH laser structure.

In particular, the BH EML 400A further preferably includes a spacer layer 410 disposed on the filter layer 408. The spacer layer 410 preferably comprises a material such as n-InP. The overall thickness of the spacer layer 410 can be the same as the spacer layer 210 of the EML 200 (See FIG. 2) to provide the predetermined offset distance between the filter layer 408 and the waveguide core provided by the MQW 414. The overall length L12 of the isolation section 409 is preferably in a range of 20 to 200 microns.

As further shown, a grating layer 411 is disposed on the spacer layer 410. First and second blocking structures 430-1, 430-2 are preferably disposed on the grating layer 411. The first and second blocking structures 430-1, 430-2 preferably comprise Fe-doped InP, although other materials are within the scope of this disclosure.

A first confinement layer 412-1 is preferably disposed between the first and second blocking structures 430-1, 430-2. The first confinement layer 412-1 is further preferably disposed on the grating layer 411. An MQW 414 is further preferably disposed on the first confinement layer 412-1 and between the first and second blocking structures 430-1, 430-2. A second confinement layer 412-2 is further preferably disposed on the MQW 414 and is disposed between the first and second blocking structures 430-1, 430-2.

A top cladding layer 416-1 is further preferably disposed on the second confinement layer 412-2, which is disposed between the first and second blocking structures 430-1, 430-2. A contact layer 416-2 is further preferably disposed on the top cladding layer 416-1, and is disposed between the first and second blocking structures 430-1, 430-2.

The overall length L9 of the BH EML 400A is preferably in a range of 450 to 900 microns. The overall width W3 of the BH EML 400A is preferably in a range of 200 to 500 microns. The overall height H3 of the BH EML 400A is preferably in a range of 80 to 150 microns. The overall length L10 of the EAM section 404 is preferably in a range of 80 to 200 microns. The overall length L11 of the DFB section 402 is preferably in a range of 250 to 500 microns.

Figure 4B:
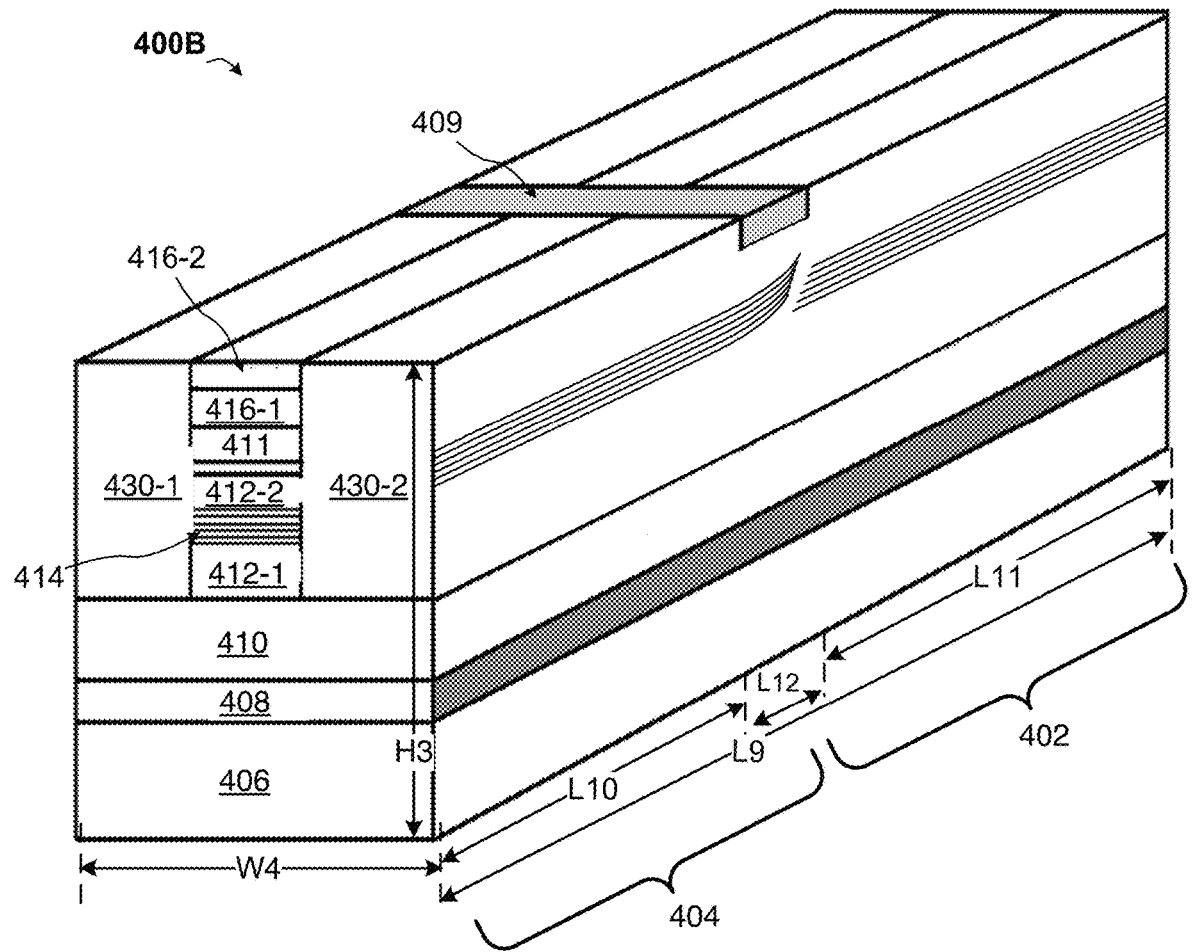
FIG. 4B shows another example BH EML consistent with aspects of the present disclosure.

FIG. 4B shows another example BH EML 400B consistent with aspects of the present disclosure. The BH EML 400B can be configured substantially similar to that of the BH EML 400A of FIG. 4A, the features of description of which is equally applicable to the BH EML 400B and will not be repeated for brevity. However, the BH EML 400B includes the grating layer 411 disposed above the MQW 414 rather than below the same (e.g., between the MQW 414 and the substrate 406) as shown in the BH EML 400A of FIG. 4A.

Figure 5:
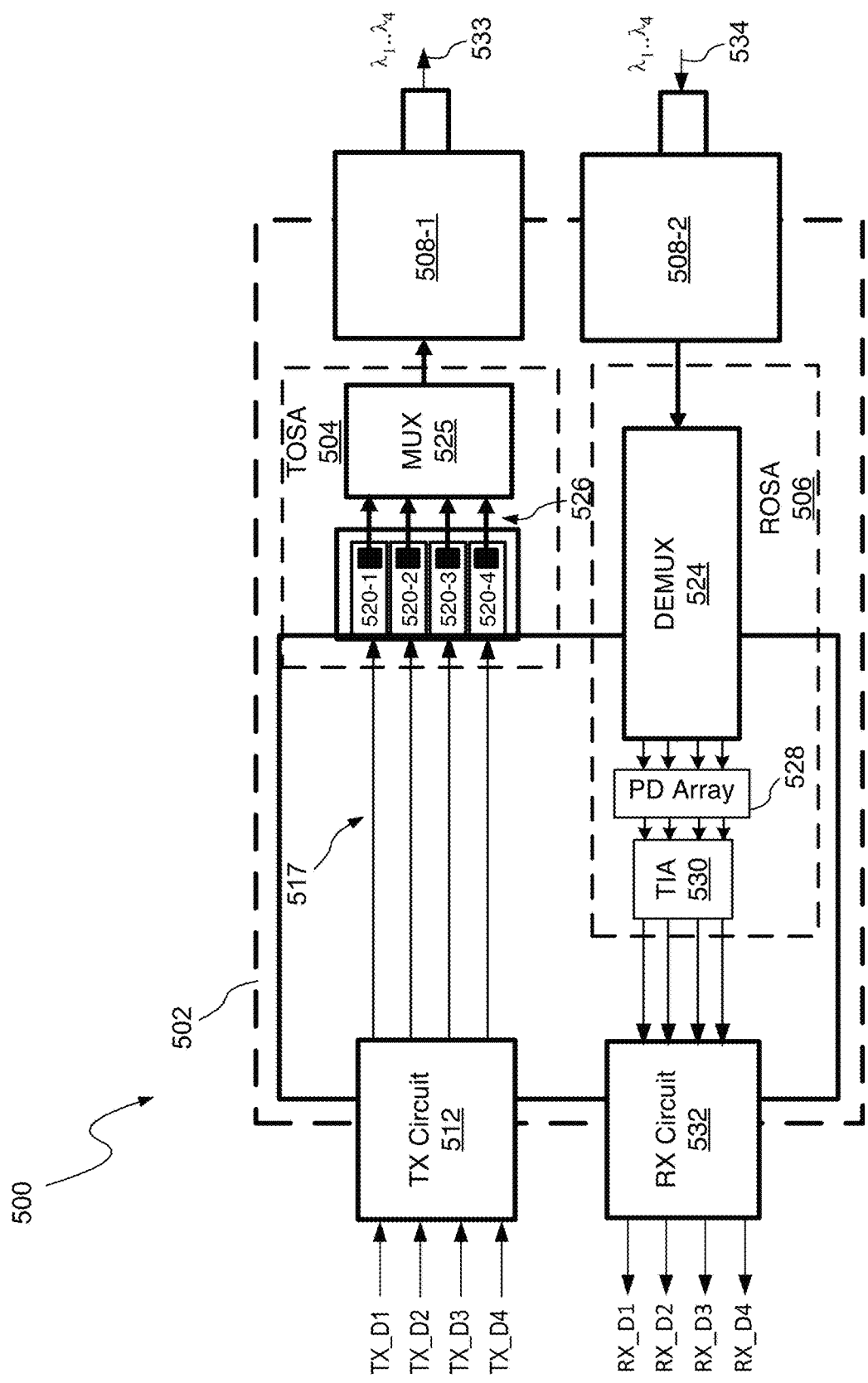
FIG. 5 shows an example multi-channel optical transceiver consistent with aspects of the present disclosure.

Turning to FIG. 5, an optical transceiver system 500, consistent with aspects of the present disclosure is shown. As shown, the optical transceiver system 500 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. Other channel wavelengths are within the scope of this disclosure including those associated with local area network (LAN) wavelength division multiplexing (WDM) and fiber to the home (FTTH). The optical transceiver system 500 may also be capable of transmission distances of 2 km to at least about 20 km. The optical transceiver system 500 may be used, for example, in internet data center applications or fiber to the home (FTTH) applications.

Preferably, the optical transceiver system 500 includes a housing 502. As shown, optical transceiver system 500 includes a transmitter optical subassembly (TOSA) arrangement 504 disposed in the housing 502 and having a plurality of laser arrangements, namely laser arrangements 520-1, 520-2, 520-3 520-4 for transmitting optical signals on different channel wavelengths, and a multi-channel receiver optical subassembly (ROSA) 506 disposed in the housing 502 for receiving optical signals having multiple different channel wavelengths. Each of the plurality of laser arrangement 520-1 to 520-4 preferably implement one or more EMLs consistent with the present disclosure, such as any one of the laser devices shown above with regard to FIGS. 1-4B. Note, the TOSA arrangement 504 can include more or fewer laser arrangements, and not necessarily four (4) as shown.

The multi-channel ROSA 506 may also be referred to herein as a ROSA arrangement. As further shown, the optical transceiver system 500 includes a transmit connecting circuit 512 and a receive connecting circuit 532 that provide electrical connections to the TOSA arrangement 504 and the multi-channel ROSA 506, respectively, within the housing 502. The transmit connecting circuit 512 is electrically connected to the electronic components in each of the laser arrangements 520-1 to 520-4 and the receive connecting circuit 532 is electrically connected to the electronic components (e.g., photodiodes, TIA(s), etc.) in the multi-channel ROSA 506. The transmit connecting circuit 512 and the receive connecting circuit 532 may be flexible printed circuits (FPCs) including at least conductive paths to provide electrical connections and may also include additional circuitry. Preferably, the transmit and receive connecting circuits 512, 532 are implemented at least in part in on a printed circuit board.

The TOSA arrangement 504 preferably electrically couples to the transmit connecting circuit 512 via electrically conductive paths 517 and is configured to receive driving signals (e.g., TX_D1 to TX_D4) and launch channel wavelengths 526 on to fiber(s) of the external transmit optical fiber 533 via multiplexing device 525 and the first optical coupling port 508-1.

Continuing on, the example multi-channel ROSA 506 shown in FIG. 5 includes a demultiplexer 524 optically coupled to the second optical coupling port 508-2 to receive an optical signal having a plurality of multiplexed channel wavelengths via the external receive optical fiber 534. An output of the demultiplexer 524 is optically coupled to a photodiode array 528. The multi-channel ROSA 506 also includes a transimpedance amplifier 530 electrically connected to the photodiode array 528. The photodiode array 528 and the transimpedance amplifier 530 detect and convert optical signals received from the demultiplexer 524 into electrical data signals (RX_D1 to RX_D4) which are output via the receive connecting circuit 532.

Figure 8:
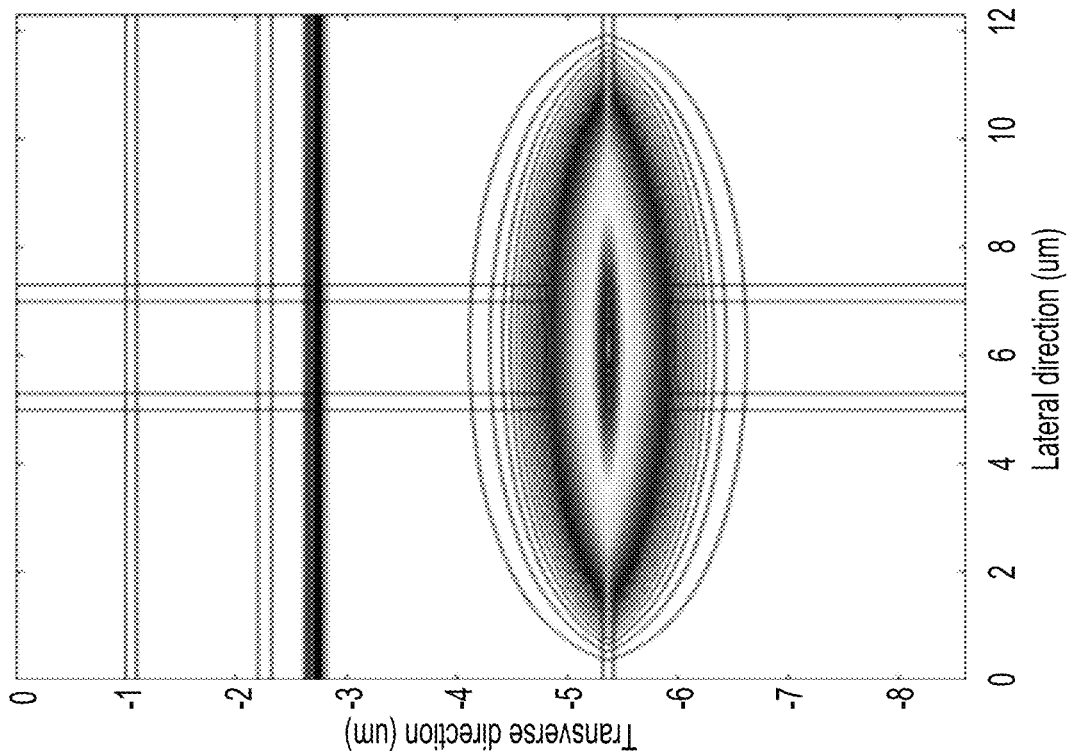
FIG. 8 shows a mode profile of an EML modulator without a filter layer consistent with the present disclosure.
Figure 9:
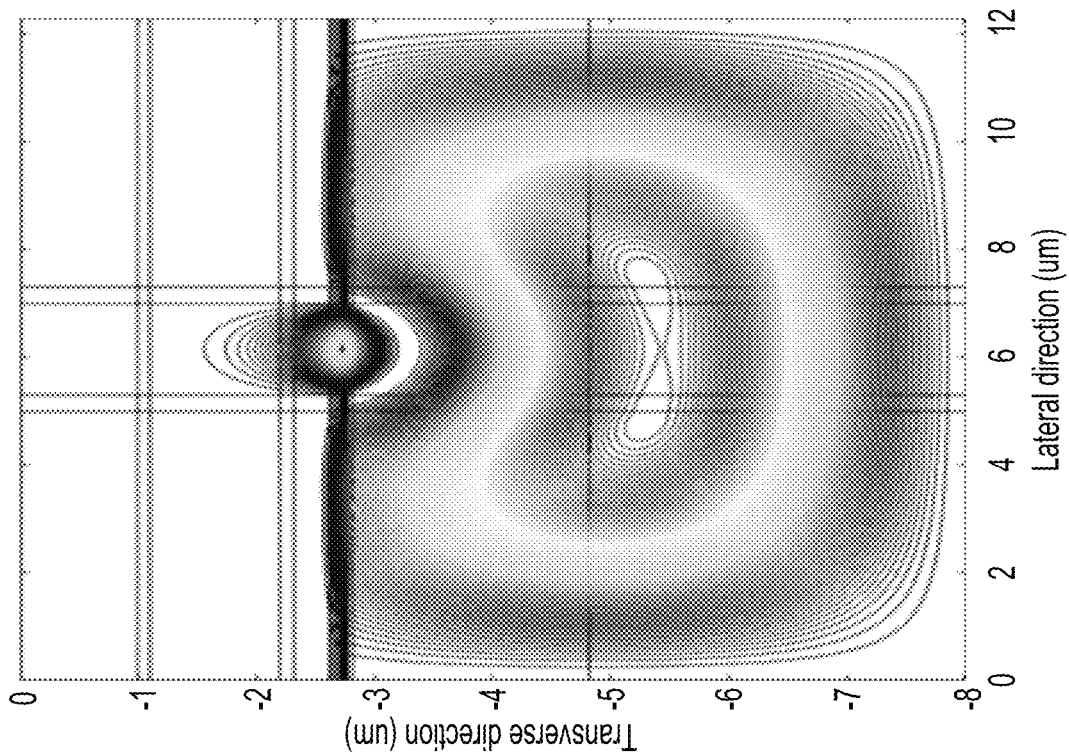
FIG. 9 shows a mode profile of an EML modulator with a filter layer consistent with the present disclosure.

FIG. 8 shows a 2D near-field intensity profile of the substrate mode for an EML without a filter layer consistent with the present disclosure, and in particular FIG. 8 shows how the optical intensity substantially extends into the substrate, that does not modulate incoming optical power and has a small overlap with the QW region that modulates incoming optical power. This indicates that the substrate mode is weakly modulated, in fact almost entirely unmodulated, which contributes to degraded ER to the EAM section. On the other hand, FIG. 9 shows an optical intensity profile of the substrate mode for an EML having a filter layer consistent with the present disclosure, and demonstrates a substantial improvement in confinement of the optical field based on the filter layer. This result is consistent across various EML configurations disclosed herein (See FIGS. 1-4B) that utilize a corresponding filter layer to absorb the substrate mode due to the same having a smaller bandgap than that of the emitted photons from the respective QWs.

Figure 10:
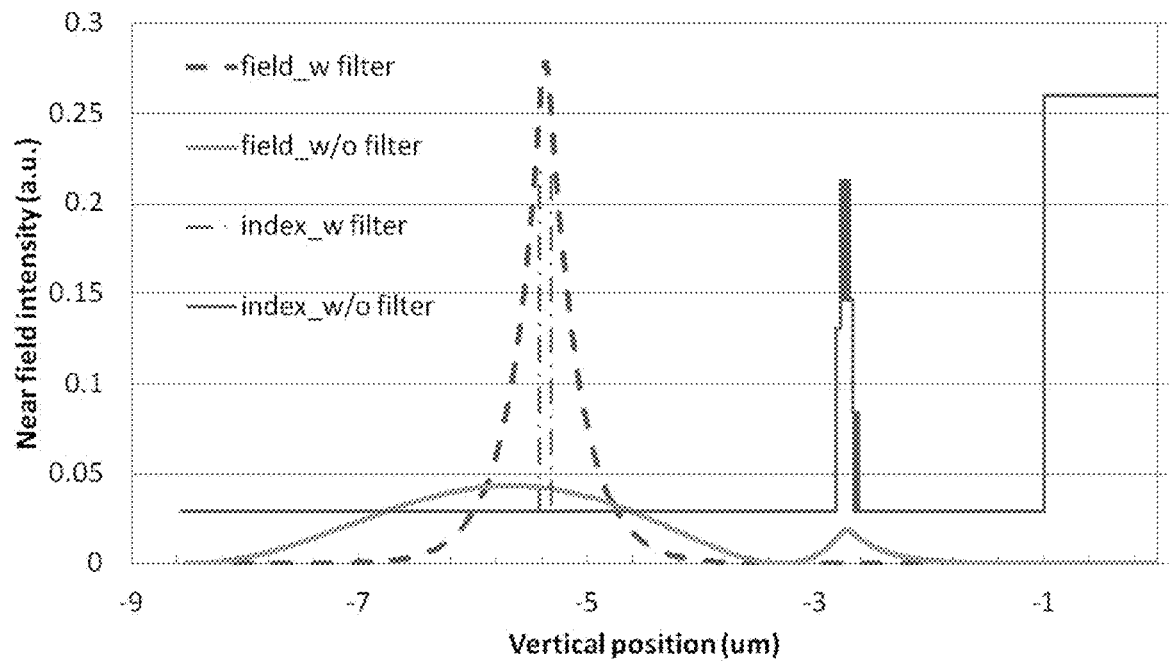
FIG. 10 is a graph showing the nearfield intensity relative to the vertical position for an EML having a filter layer consistent with the present disclosure relative to an EML without a filter layer.

FIG. 10 is a graph that that plots the 1D near field intensity relative to vertical position for an EML having a filter layer consistent with the present disclosure versus an EML without such a filter layer. As can be seen, an EML having a filter layer consistent with the present disclosure has the peak intensity in the absorptive filter layer (that has higher refractive index and smaller bandgap than the QWs), while an EML without a filter layer consistent with the present disclosure has a relatively large portion of near field intensity distributed in the unmodulating substrate layer and a small portion of the near field intensity distributed in the modulating QW region. FIG. 9 demonstrates this result in a similar fashion as FIG. 10, and shows that the filter layer confines the substrate mode and helps suppress the unmodulated power carried by the substrate mode.

Figure 11:
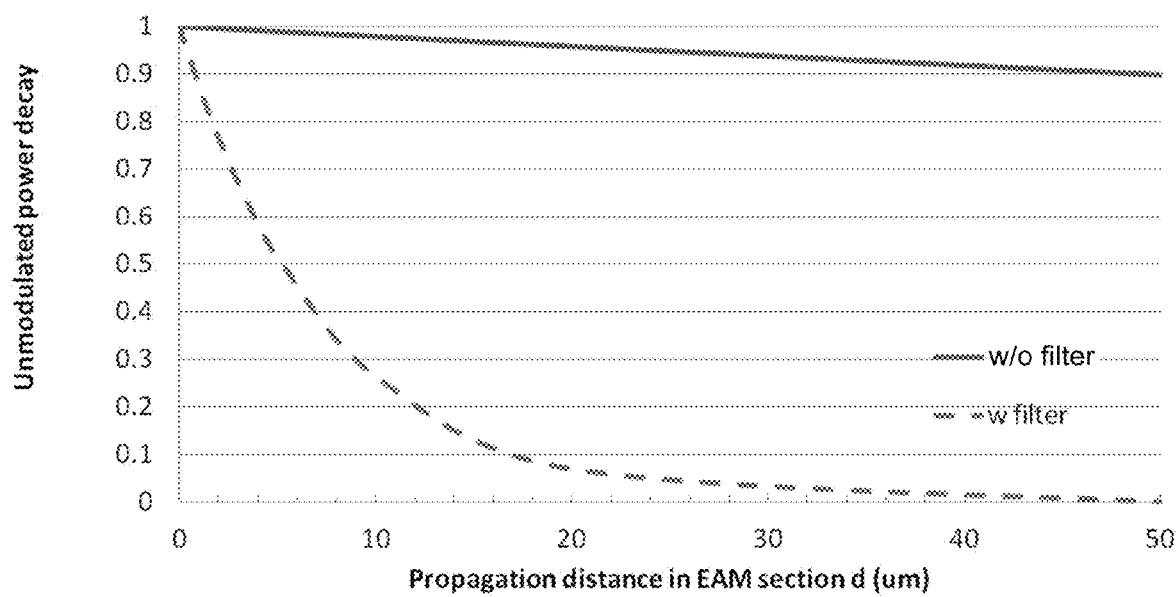
FIG. 11 is a graph showing the unmodulated power relative to the propagation distance in the modulator section.

FIG. 11 is a graph that demonstrates the fractional decay of unmodulated power with the propagation distance d in the EAM section for an EML having a filter layer consistent with the present disclosure versus an EML without such a filter layer. As is shown, an EML having a filter layer consistent with the present disclosure has the unmodulated power fully absorbed within a small propagation distance d in the EAM section, while an EML without a filter layer consistent with the present disclosure has only slightly reduced modulated power within the same propagation distance in the EAM section.

In accordance with an aspect of the present disclosure, an electro-absorption modulated laser (EML) to emit a predetermined channel wavelength is disclosed. The EML comprising a substrate, a distributed feedback (DFB) section provided by a first plurality of layers disposed on the substrate, an electro-absorption modulator (EAM) section provided by a second plurality of layers disposed on the substrate, an active region provided by the DFB section and the EAM section, a filter layer disposed between the substrate and the active region, the filter layer comprising a material with an energy band gap less than an energy bandgap of the predetermined channel wavelength.

In accordance with another aspect of the present disclosure a transmitter optical subassembly (TOSA) is disclosed. The TOSA comprising an electro-absorption modulated laser (EML) to emit a predetermined channel wavelength, the EML comprising a plurality of layers disposed on a substrate to provide an active region, and wherein the EML includes a filter layer disposed between the substrate and the active region, the filter layer comprising a material with an energy band gap that is less than the energy band gap of the predetermined channel wavelength.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An electro-absorption modulated laser (EML) to emit a predetermined channel wavelength, the EML comprising:
    a substrate;
    a distributed feedback (DFB) section provided by a first plurality of layers disposed on the substrate;
    an electro-absorption modulator (EAM) section provided by a second plurality of layers disposed on the substrate;
    an active region provided by the DFB section and the EAM section;
    a filter layer disposed between the substrate and the active region, the filter layer comprising a material with an energy band gap less than an energy bandgap of the predetermined channel wavelength.

2. The EML of claim 1, wherein the predetermined channel wavelength is in a range of 1260 to 1650 nm.

3. The EML of claim 2, wherein the filter layer comprises indium gallium arsenide (InGaAs).

4. The EML of claim 3, wherein the material forming the filter layer is selected from a group consisting of indium gallium arsenide (InGaAs), indium gallium arsenide phosphide (InGaAsP), indium gallium arsenide phosphide antimony (InGaAsSb), and aluminum gallium indium arsenic (AlGaInAs).

5. The EML of claim 1, wherein the filter layer has an overall thickness in a range of 200 to 2000 Angstrom.

6. The EML of claim 1, wherein the filter layer is disposed directly on the substrate.

7. The EML of claim 1, wherein the active region includes a multi-quantum well (MQW), and wherein the filter layer is disposed from a waveguide core provided by the MQW at a first offset distance OD1.

8. The EML of claim 7, wherein the first offset distance OD1 is in a range of 1.5 to 3.0 microns.

9. The EML of claim 7, further comprising a spacer layer disposed between the filter layer and the waveguide core of the MQW.

10. The EML of claim 9, wherein the spacer layer comprises indium phosphide (InP).

11. The EML of claim 9, wherein the first offset distance OD1 is provided at least in part by the spacer layer.

12. The EML of claim 1 implemented as a buried heterostructure (BH) EML.

13. The EML of claim 1 implemented as a ridge-waveguide (RWG) EML.

14. A transmitter optical subassembly (TOSA) comprising:
    an electro-absorption modulated laser (EML) to emit a predetermined channel wavelength, the EML comprising a plurality of layers disposed on a substrate to provide an active region, and wherein the EML includes a filter layer disposed between the substrate and the active region, the filter layer comprising a material with an energy band gap that is less than the energy band gap of the predetermined channel wavelength.

15. The TOSA of claim 14, wherein the predetermined channel wavelength is in a range of 1260 to 1650 nm.

16. The TOSA of claim 14, wherein the filter layer comprises indium gallium arsenide (InGaAs).

17. The TOSA of claim 14, wherein the material forming the filter layer is selected from a group consisting of indium gallium arsenide (InGaAs), indium gallium arsenide phosphide (InGaAsP), indium gallium arsenide phosphide antimony (InGaAsSb), and aluminum gallium indium arsenic (AlGaInAs).

18. The TOSA of claim 14, wherein the filter layer has an overall thickness in a range of 200 to 2000 Angstrom.

19. The EML of claim 1, wherein the filter layer is configured to absorb at least a portion of unmodulated light.

20. The TOSA of claim 14, wherein the filter layer is configured to absorb at least a portion of unmodulated light.

* * * * *